United States Patent
Olgado et al.

(10) Patent No.: US 6,770,565 B2
(45) Date of Patent: Aug. 3, 2004

(54) SYSTEM FOR PLANARIZING METAL CONDUCTIVE LAYERS

(75) Inventors: Donald J. K. Olgado, Palo Alto, CA (US); Avi Tepman, Cupertino, CA (US); Dmitry Lubomirsky, Cupertino, CA (US); Timothy R. Webb, San Mateo, CA (US)

(73) Assignee: Applied Materials Inc., Santa Clara, CA (US)

( * ) Notice: Subject to any disclaimer, the term of this patent is extended or adjusted under 35 U.S.C. 154(b) by 1 day.

(21) Appl. No.: 10/043,561

(22) Filed: Jan. 8, 2002

(65) Prior Publication Data

US 2003/0129850 A1 Jul. 10, 2003

(51) Int. Cl.$^7$ ................................................ H01L 2/302
(52) U.S. Cl. ...................................... 438/706; 438/745
(58) Field of Search ................................. 438/689, 697, 438/706, 712, 714, 720, 745, 754

(56) References Cited

U.S. PATENT DOCUMENTS

| | | | |
|---|---|---|---|
| 3,727,620 A | 4/1973 | Orr | 134/95 |
| 3,770,598 A | 11/1973 | Creutz | 204/52 R |
| 3,772,105 A | 11/1973 | Shipley | 156/19 |
| 3,953,265 A | 4/1976 | Hood | 156/8 |
| 3,990,462 A | 11/1976 | Elftmann et al. | 134/102 |
| 4,027,686 A | 6/1977 | Shortes et al. | 134/33 |
| 4,092,176 A | 5/1978 | Kozai et al. | 134/186 |
| 4,110,176 A | 8/1978 | Creutz et al. | 204/52 R |
| 4,113,492 A | 9/1978 | Sato et al. | 96/67 |
| 4,315,059 A | 2/1982 | Raistricj et al. | 429/112 |
| 4,326,940 A | 4/1982 | Eckles et al. | 204/232 |
| 4,336,114 A | 6/1982 | Mayer et al. | 204/52 R |
| 4,376,685 A | 3/1983 | Watson | 204/52 R |
| 4,405,416 A | 9/1983 | Raistrick et al. | 204/68 |
| 4,429,983 A | 2/1984 | Cortellino et al. | 354/320 |
| 4,435,266 A | 3/1984 | Johnston | 204/276 |
| 4,439,244 A | 3/1984 | Allevato | 134/33 |
| 4,489,740 A | 12/1984 | Rattan et al. | 134/140 |
| 4,510,176 A | 4/1985 | Cuthbert et al. | 427/82 |

(List continued on next page.)

FOREIGN PATENT DOCUMENTS

| | | | |
|---|---|---|---|
| DE | 41 09 955 | 10/1992 | H01L/21/321 |
| DE | 42 02 194 | 7/1993 | B05C/9/08 |

(List continued on next page.)

OTHER PUBLICATIONS

Semitool, Inc., "Metallization & Interconnect" (1998), 4 pages.

Censak, R.J., Spin Basket, IBM Tech Disc. Bull, vol. 18, No. 8 (Jan. 1876), pp. 2476–2477.

(List continued on next page.)

*Primary Examiner*—Kin-Chan Chen
(74) *Attorney, Agent, or Firm*—Moser, Patterson & Sheridan

(57) ABSTRACT

A method of planarizing a metal conductive layer on a substrate is provided. In one embodiment, a substrate having a metal conductive layer disposed on a top surface of the substrate is provided on a substrate support. The substrate support is rotated and the top surface of the substrate is contacted with a liquid etching composition. The metal conductive layer is then exposed to an etchant gas in order to planarize the top surface of the metal conductive layer. Also provided is an apparatus for etching a metal conductive layer on a substrate. The apparatus comprises a container, a substrate support disposed in the container, a rotation actuator attached to the substrate support, and a fluid delivery assembly disposed in the container.

10 Claims, 10 Drawing Sheets

U.S. PATENT DOCUMENTS

| | | | | |
|---|---|---|---|---|
| 4,518,678 A | | 5/1985 | Allen | 430/311 |
| 4,519,846 A | | 5/1985 | Aigo | 134/15 |
| 4,633,804 A | | 1/1987 | Arii | 118/52 |
| 4,688,918 A | | 8/1987 | Suzuki et al. | 354/325 |
| 4,693,805 A | | 9/1987 | Quazi | 204/192.22 |
| 4,732,785 A | | 3/1988 | Brewer | 427/240 |
| 4,788,994 A | | 12/1988 | Shinbara | 134/157 |
| 4,838,289 A | | 6/1989 | Kottman et al. | 134/153 |
| 4,976,810 A | * | 12/1990 | Masuda et al. | 216/49 |
| 5,039,381 A | | 8/1991 | Mullarkey | 204/47.5 |
| 5,055,425 A | | 10/1991 | Leibovitz et al. | 437/195 |
| 5,092,975 A | | 3/1992 | Yamamura et al. | 204/198 |
| 5,155,336 A | | 10/1992 | Gronet et al. | 219/411 |
| 5,162,260 A | | 11/1992 | Leibovitz et al. | 437/195 |
| 5,176,783 A | | 1/1993 | Yoshikawa | 156/345 |
| 5,222,310 A | | 6/1993 | Thompson et al. | 34/202 |
| 5,224,504 A | | 7/1993 | Thompson et al. | 134/155 |
| 5,230,743 A | | 7/1993 | Thompson et al. | 134/32 |
| 5,252,807 A | | 10/1993 | Chizinsky | 219/390 |
| 5,256,274 A | | 10/1993 | Poris | 205/123 |
| 5,259,407 A | | 11/1993 | Tuchida et al. | 134/151 |
| 5,290,361 A | | 3/1994 | Hayashida et al. | 134/2 |
| 5,316,974 A | | 5/1994 | Crank | 437/190 |
| 5,328,589 A | | 7/1994 | Martin | 205/296 |
| 5,349,978 A | | 9/1994 | Sago et al. | 134/153 |
| 5,351,360 A | | 10/1994 | Suzuki et al. | 15/302 |
| 5,368,711 A | | 11/1994 | Poris | 204/193 |
| 5,377,708 A | | 1/1995 | Bergman et al. | 134/105 |
| 5,415,890 A | | 5/1995 | Kloiber et al. | 427/242 |
| 5,447,615 A | | 9/1995 | Ishida | 204/224 R |
| 5,482,174 A | | 1/1996 | Namiki et al. | 216/41 |
| 5,486,234 A | * | 1/1996 | Contolini et al. | 216/91 |
| 5,608,943 A | | 3/1997 | Konishi et al. | 15/302 |
| 5,625,170 A | | 4/1997 | Poris | 177/50 |
| 5,634,980 A | | 6/1997 | Tomita et al. | 134/3 |
| 5,651,865 A | | 7/1997 | Sellers | 204/192.13 |
| 5,667,630 A | * | 9/1997 | Lo | 438/653 |
| 5,705,223 A | | 1/1998 | Bunkofske | 427/240 |
| 5,718,813 A | | 2/1998 | Drummond et al. | 204/192.12 |
| 5,723,028 A | | 3/1998 | Poris | 204/231 |
| 5,753,133 A | | 5/1998 | Wong et al. | 216/67 |
| 5,783,097 A | | 7/1998 | Lo et al. | 216/41 |
| 5,879,577 A | | 3/1999 | Weng et al. | 216/92 |
| 5,897,379 A | | 4/1999 | Ulrich et al. | 438/754 |
| 5,939,139 A | | 8/1999 | Fujimoto | 427/240 |
| 5,976,267 A | | 11/1999 | Culkins et al. | 134/6 |
| 5,997,653 A | | 12/1999 | Yamasaka | 134/2 |
| 6,017,437 A | | 1/2000 | Ting et al. | 205/80 |
| 6,019,843 A | | 2/2000 | Park et al. | 118/52 |
| 6,062,288 A | | 5/2000 | Tateyama | 156/584 |
| 6,063,232 A | | 5/2000 | Terasawa | 156/345 |
| 6,090,717 A | * | 7/2000 | Powell et al. | 438/710 |
| 6,093,335 A | * | 7/2000 | Bhatt et al. | 216/91 |
| 6,114,254 A | | 9/2000 | Rolfson | 438/758 |
| 6,117,778 A | | 9/2000 | Jones et al. | 438/692 |
| 6,120,641 A | | 9/2000 | Stevens et al. | 156/345 |
| 6,150,215 A | | 11/2000 | Lin et al. | 438/253 |
| 6,150,269 A | * | 11/2000 | Roy | 438/687 |
| 6,290,865 B1 | | 9/2001 | Lloyd et al. | 216/92 |
| 6,299,697 B1 | * | 10/2001 | Nishibe et al. | 134/3 |
| 6,309,981 B1 | | 10/2001 | Mayer et al. | 438/754 |
| 6,315,883 B1 | | 11/2001 | Mayer et al. | 205/123 |
| 6,333,275 B1 | | 12/2001 | Mayer et al. | 438/745 |
| 6,447,668 B1 | | 9/2002 | Wang | 205/645 |
| 6,461,914 B1 | * | 10/2002 | Roberts et al. | 438/253 |
| 2002/0037684 A1 | * | 3/2002 | Yamamoto et al. | 451/41 |

FOREIGN PATENT DOCUMENTS

| | | | |
|---|---|---|---|
| FR | 2.623.134 | 5/1989 | B44C/1/26 |
| JP | 01-316936 | 12/1989 | H01L/21/306 |
| JP | 02-253620 | 10/1990 | H01L/21/304 |
| JP | 02-272738 | 11/1990 | H01L/21/321 |
| JP | 03-220723 | 9/1991 | H01L/21/306 |
| JP | 05-013322 | 1/1993 | H01L/21/027 |
| JP | 05-160104 | 6/1993 | H01L/21/306 |
| JP | 06-017291 | 1/1994 | C25D/7/12 |
| JP | 06-124887 | 5/1994 | H01L/21/027 |
| JP | 08-037143 | 2/1996 | H01L/21/027 |
| JP | 09-017768 | 1/1997 | H01L/21/306 |
| WO | 97/12079 | 4/1997 | C25D/5/02 |
| WO | 99/25903 | 5/1999 | C25D/5/00 |
| WO | 99/25904 | 5/1999 | C25D/5/02 |

OTHER PUBLICATIONS

Singer, P., "Wafer Processing", Semitool International (Jun. 1998), p. 70.

Singer, P., "Tantalum, Copper and Damascene: The Futrue of Interconnects" Semiconductor International (Jun. 1998).

* cited by examiner

SYSTEM FOR PLANARIZING METAL CONDUCTIVE LAYERS

BACKGROUND OF THE DISCLOSURE

1. Field of the Invention

The present invention relates to planarizing metal conductive layers, more particularly to planarizing metal conductive layers for use in integrated circuits and other electronic devices.

2. Description of the Background Art

Integrated circuits have evolved into complex devices that can include millions of components (e.g., transistors, capacitors, and resistors) on a single chip. The evolution of chip designs continually requires faster circuitry and greater circuit density. The demands for greater circuit density necessitate a reduction in the dimensions of the integrated circuit components.

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts, lines, plugs and other features, as well as the dielectric materials between them, decrease to less than 250 nanometers. The thickness of the dielectric layers, however, remains substantially constant, with the result that the aspect ratios for the features, i.e., their height divided by width, increases. Due to copper's electrical performance at such small feature sizes, copper has become a preferred metal for filling sub-quarter micron, high aspect ratio interconnect features on substrates.

In order to fill high aspect ratio features copper is typically electroplated to a thickness that exceeds the height of the feature, resulting in the deposition of copper in the "field" region above the feature. The copper is then typically planarized using a chemical mechanical planarization (CMP) process in order to remove copper from the field and to provide a smooth surface. Subsequent to CMP, dielectric and other material layers are deposited atop the metal feature.

However, CMP processes used to planarize metal conductive layers, particularly copper layers, use chemical slurries of abrasive materials which are aggressive and can damage dielectric material layers adjacent to the metal conductive layer. Furthermore, metals such as copper show tendencies to form various defects during CMP processing.

Furthermore, the system for deposition and planarization of copper that is commonly used in integrated circuit manufacture requires depositing the metal conductive layer in an electroplating metal deposition platform, planarizing the metal conductive layer using a CMP platform, and then depositing a dielectric layer using a third platform. The use of three separate platforms reduces overall system throughput and provides increased opportunities for contamination of the wafer and devices thereon.

Therefore, a need exists for a system for planarizing metal conductive layers that is less aggressive than CMP and is compatible with integrated circuit processing.

SUMMARY OF THE INVENTION

The present invention generally provides a method of planarizing a metal conductive layer on a substrate. In one embodiment, a substrate having a metal conductive layer disposed on a top surface of the substrate is provided on a substrate support. The substrate support is rotated and the top surface of the substrate is contacted with a liquid etching composition in order to remove portions of a top surface of the metal conductive layer. The metal conductive layer is then exposed to an etchant gas in order to planarize the top surface of the metal conductive layer.

In another embodiment, a substrate having a metal conductive layer disposed on a top surface of the substrate is provided on a substrate support. The substrate has stray metal conductive material on one or more other surfaces, such as an edge or bottom surface of the substrate. The substrate support is rotated and the top surface of the substrate is contacted with a liquid etching composition in order to remove portions of a top surface of the metal conductive layer. One or more other surfaces of the substrate are contacted with a second liquid etching composition in order to remove stray metal conductive material. The metal conductive layer is exposed to an etchant gas in order to planarize the top surface of the metal conductive layer.

In another embodiment, a metal conductive feature is formed on a substrate. A substrate having a metal conductive layer disposed on a top surface of the substrate is provided on a substrate support. A material layer is provided on the top surface of the substrate, and the material layer has at least one opening therethrough. A metal conductive layer is deposited on the substrate such that the metal conductive layer completely fills the opening. The substrate is rotated and the top surface of the substrate is contacted with a liquid etching composition in order to remove portions of a top surface of the metal conductive layer. The metal conductive layer is then exposed to an etchant gas in order to planarize the top surface of the metal conductive layer.

Also provided is an apparatus for etching a metal conductive layer on a substrate. The apparatus comprises a container, a substrate support disposed in the container, a rotation actuator attached to the substrate support, and a fluid delivery assembly disposed in the container to deliver liquid etching composition to a top surface of a substrate disposed on the substrate support.

The present invention provides an efficient method for planarizing metal conductive layers without the problems that accompany the use of abrasive polishing processes. By using the method of the present invention one may reduce the number of process platforms and improve process throughput.

BRIEF DESCRIPTION OF THE DRAWINGS

The teachings of the present invention can be readily understood by considering the following detailed description in conjunction with the accompanying drawings, in which.

DETAILED DESCRIPTION

A. Wet Etch Apparatus

Figure 1:
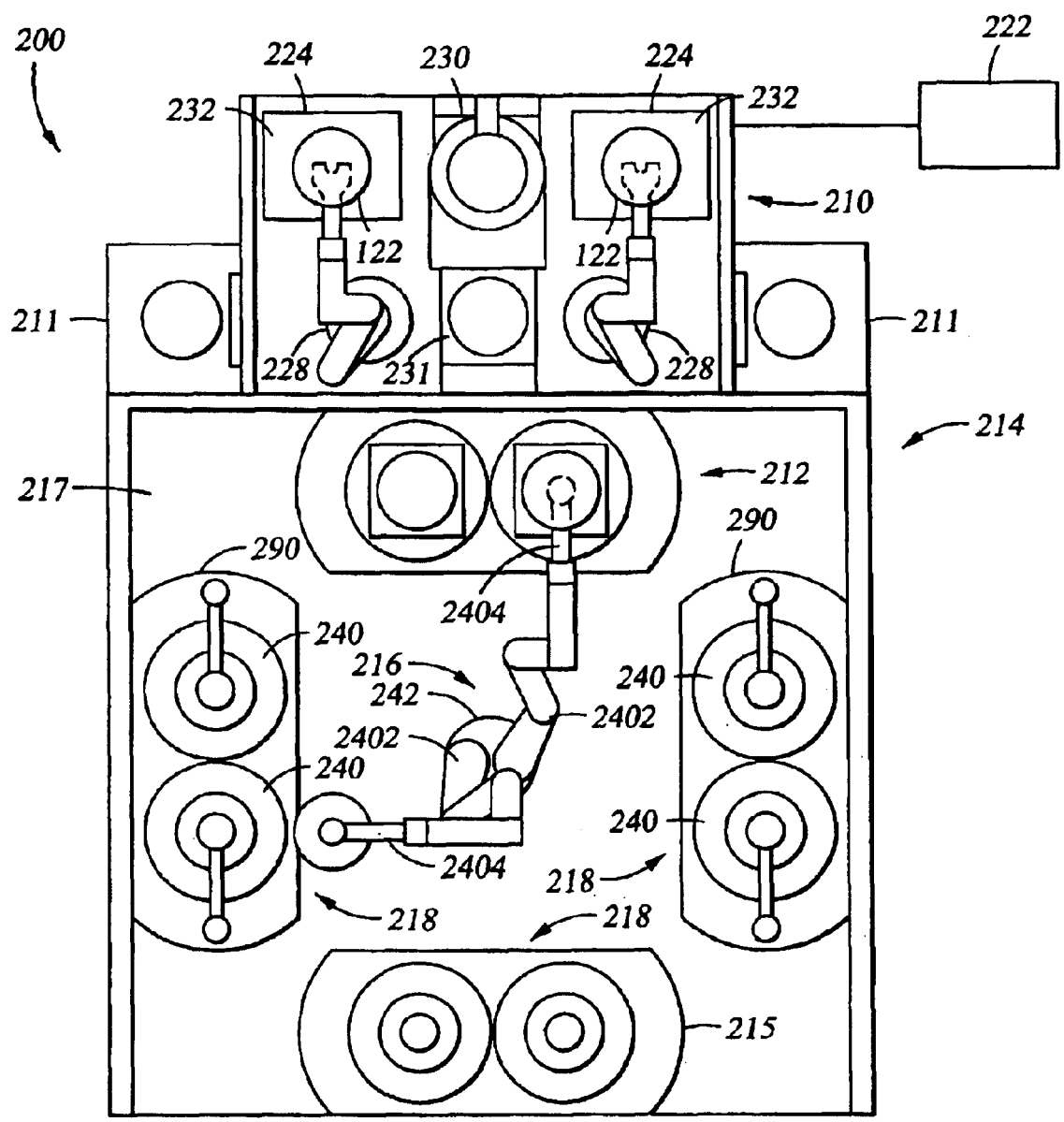
FIG. 1 depicts a schematic illustration of an electroplating system platform.

FIG. 1 is a schematic view of an electroplating system platform 200 incorporating an etch-back module 212 suitable for the process of the present invention. The electroplating system platform 200 generally comprises a loading station 210, a thermal annealing chamber 211, a mainframe 214, and an electrolyte replenishing system (not shown). The mainframe 214 generally comprises a mainframe transfer station 216, a etch-back module 212, a plurality of processing stations 218 including electroplating cells 240, and a seed layer repair station 215.

Preferably, the electroplating system platform 200, particularly the mainframe 214, is enclosed in a clean environment using panels such as acrylic panels. The mainframe 214 includes a base 217 having cut-outs to support various stations needed to complete the electrochemical deposition process. The base 217 is preferably made of aluminum, stainless steel or other rigid material that can support the various stations disposed thereon. A chemical protection coating, such as Halar™, ethylene-chloro-tri-fluoro-ethylene (ECTFE), or other protective coatings, is preferably disposed over the surfaces of the base 217 that are exposed to potential chemical corrosion. Preferably, the protective coating provides good conformal coverage over the conductive metal base 217, adheres well to the conductive metal base 217, provides good ductility, and resists cracking under normal operating conditions of the system.

Each processing station 218 includes one or more processing cells 240. An electrolyte replenishing system (not shown) is positioned adjacent the mainframe 214 and connected to the process cells 240 individually to circulate electrolyte used for the electroplating process. The electroplating system platform 200 also includes a power supply station (not shown) for providing electrical power to the system and a control system 222, typically comprising a programmable microprocessor.

The mainframe transfer station 216 includes a mainframe transfer robot 242 disposed centrally to provide substrate transfer between various stations on the mainframe. Preferably, the mainframe transfer robot 242 comprises a plurality of individual robot arms 2402 that provides independent access to wafers in the processing stations 218 the etch-back module 212, the seed layer repair stations, and other processing stations disposed on or in connection with the mainframe.

As shown in FIG. 1, the mainframe transfer robot 242 comprises a plurality of robot arms 2402, corresponding to the number of processing cells 240 per processing station 218. Each robot arm 2402 includes an end effector 2404 for holding a wafer during a wafer transfer. Preferably, each robot arm 2402 is operable independently of the other arm to facilitate independent transfers of wafers in the system. Alternatively, the robot arms 2402 operate in a linked fashion such that one robot extends as the other robot arm retracts. The mainframe transfer robot 242 includes a plurality of robot arms 2402 (two shown), and a flipper robot is attached as an end effector 2404 for each of the robot arms 2402.

Flipper robots are generally known in the art and can be attached as end effectors for wafer handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation.

The loading station 210 preferably includes one or more substrate cassette receiving areas 224, one or more loading station transfer robots 228 and at least one substrate orientor 230. The number of substrate cassette receiving areas, loading station transfer robots 228 and substrate orientor 230 included in the loading station 210 can be configured according to the desired throughput of the system.

A substrate cassette 232 containing substrates 122 is loaded onto the substrate cassette receiving area 224 to introduce substrates 122 into the electroplating system platform. The loading station transfer robot 228 transfers substrates 122 between the substrate cassette 232 and the substrate orientor 230. The loading station transfer robot 228 comprises a typical transfer robot commonly known in the art. The substrate orientor 230 positions each substrate 122 in a desired orientation to ensure that the substrate is properly processed. The loading station transfer robot 228 also transfers substrates 122 between the loading station 210 and the thermal annealing chamber 211, and between the loading station 210 and the etch-back module 212. The loading station 210 preferably also includes a substrate cassette 231 for temporary storage of substrates as needed to facilitate efficient transfer of substrates through the system.

Figure 2:
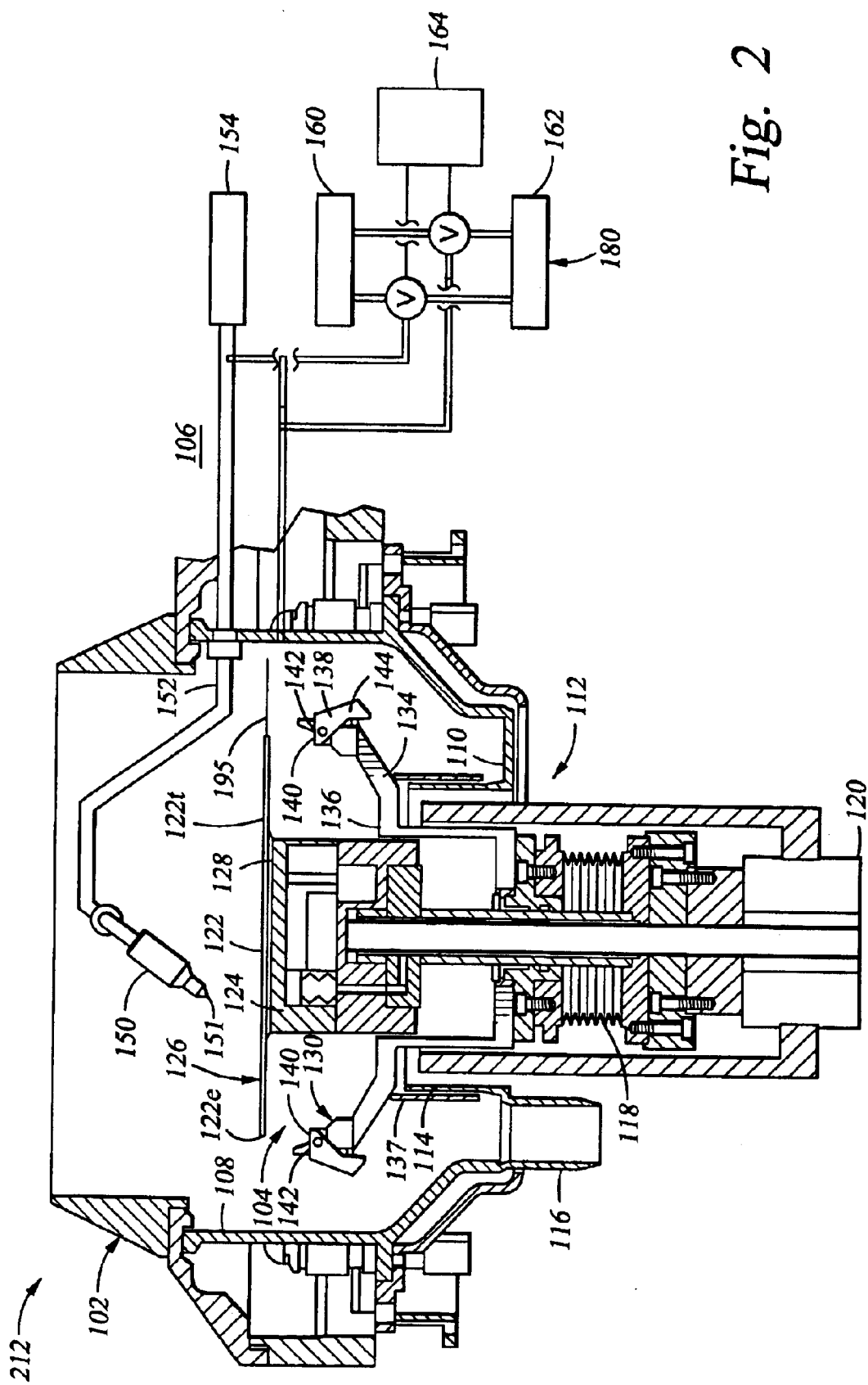
FIG. 2 depicts a schematic cross-sectional illustration of a side view of an etch-back module that can be used for the practice of embodiments described herein.

FIG. 2 depicts a side cross-sectional view of an etch-back module 212 of the present invention. In the embodiment of the invention as shown in FIG. 1, the etch-back module 212 includes a substrate 122 disposed in an electroplating system platform 200 for removing excess metal deposited on the substrate. Thus, the numbers of platforms required is reduced. The etch-back module 212 can be a stand-alone unit or disposed as a component of an electroplating system platform 200 or other deposition system. The etch-back module 212 is preferably connected to the loading station 210, and substrates are transferred into and out of the etch-back module 212 by the loading station transfer robot 228. Although only one etch-back module 212 is shown in FIG. 1, electroplating platform 200 may comprise several etch-back modules 290. The etch-back modules 290 may be disposed on opposing sides of the loading station 210 or in other configurations within electroplating platform 200.

The etch-back module 212 comprises a container 102, a wafer holder assembly 104 and a fluid delivery assembly 106. The container 102 preferably includes a cylindrical sidewall 108, a container bottom 110 having a central opening 112, and an upturned inner wall 114 extending upwardly from the peripheral edge of the central opening 112. A fluid outlet 116 is connected to the container bottom 110 to facilitate draining of the used fluids and chemicals from the etch-back module 100.

The wafer holder assembly 104 is disposed above the central opening 112 and includes a lift assembly 118 and a rotation assembly 120 that extends through the central opening 112. The lift assembly 118 preferably comprises a bellows-type lift or a lead-screw stepper motor type lift assembly, which are well known in the art and commercially available. The lift assembly 118 facilitates transfer and positioning of the substrate 122 on the wafer holder assembly 104 between various vertical positions. The rotation assembly 120 preferably comprises a rotary motor that is attached below the lift assembly.

The wafer holder assembly 104 preferably comprises a vacuum chuck 124 that secures a substrate 122 from the wafer backside and does not obstruct an edge 122e of the substrate 122. Preferably, an annular seal 128, such as a compressible O-ring, is disposed at a peripheral portion of the vacuum chuck surface to seal the vacuum chuck 124 from the fluids and chemicals used during the edge bead removal process. The wafer holder assembly 104 preferably includes a wafer lift 130 that facilitates transfer of a wafer from a robot blade of a transfer robot onto the wafer holder assembly 104.

The wafer lift 130, as shown in FIG. 2, comprises a spider clip assembly that also can be used to secure a wafer during a spin-rinse-dry process. The spider clip assembly comprises a plurality of arms 134 extending from an annular base 136 and a spider clip 138 pivotally disposed at the distal end of the arm 134. The annular base 136 includes a downwardly extending wall 137 that overlaps the upturned inner wall 114 to contain fluids used during processing inside the container 102. The spider clip 138 includes an upper surface 140 for receiving the wafer, a clamp portion 142 for clamping the wafer, and a lower portion 144 that causes the clamp portion 142 to engage the edge of the wafer due to centrifugal force when the wafer holder assembly is rotated. Alternatively, the wafer lift 130 comprises commonly used wafer lifts in various wafer processing apparatus, such as a set of lift pins or a lift hoop disposed on a lift platform or lift ring in or around the vacuum chuck body.

The fluid delivery assembly 106 comprises one or more top nozzles 150 disposed on one or more dispense arms 152. Each of the one or more top nozzles 150 has an opening 151 therethrough through which fluids may be dispensed. The dispense arm 152 extends through the container sidewall 108 and is attached to an actuator 154 that extends and retracts to vary the position of the one or more top nozzles 150 over the substrate 122. By having an extendable dispense arm 152, the one or more top nozzles 150 may be positioned over the substrate 122 to point the one or more top nozzles 150 toward a portion of a top surface 122t of the wafers which enhances the control over the delivery of fluids to the top surface of the substrate 122. Alternatively, the dispense arm 152 is fixedly attached to the container sidewall 108, and the one or more top nozzles 150 are secured to the dispense arm in a position that does not interfere with vertical wafer movement in the container 102.

Preferably, the dispense arm 152 includes one or more conduits (not shown) extending through the dispense arm for connecting the one or more top nozzles 150 to one or more fluid sources 180. Alternatively, the one or more top nozzles 150 is connected through a flexible tubing (not shown) disposed through a conduit (not shown) in the dispense arm 152.

The one or more fluid sources 180 include one or more etchant sources 160. Each of the one or more etchant sources 160 comprise one or more etchants. The one or more etchants may be selected from nitric acid, hydrochloric acid, persulfates and peroxygen compounds, among other commercially available acids and oxidizers.

The one or more fluid sources 180 may also comprise one or more rinse fluid sources 162. The one or more rinse fluid sources 162 typically comprise deionized water. The one or more rinse fluid sources 162 may comprise one or more other constituents, such as, for example, hydrogen peroxide, buffers and pH adjusting components.

The one or more top nozzles 150 can be selectively connected to the one or more fluid sources 180, such as fluid sources 162 and etchant sources 160, and a computer control 164 switches the connection between the one or more fluid sources according to a desired program. Alternatively, a first set of top nozzles are connected to the one or more etchant sources 160 and a second set of top nozzles are connected to the one or more rinse sources 162, and the nozzles are selectively activated to provide fluids to the substrate 122.

Figure 3:
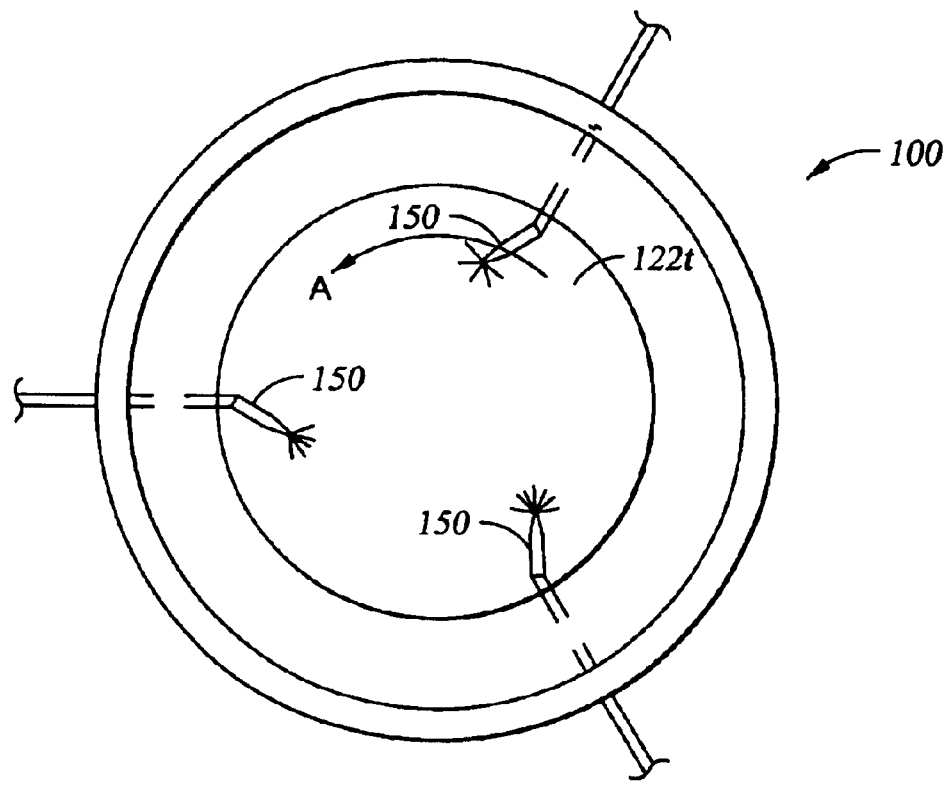
FIG. 3 depicts a schematic illustration of a top view of an etch-back module that can be used for the practice of embodiments described herein.

FIG. 3 is a top schematic view of an etch-back module 212 illustrating one embodiment of the positions of the one or more top nozzles 150 for removal of portions of a metal conductive layer from a top surface 122t of a substrate 122. The substrate 122 may be a semiconductor wafer. As shown, three top nozzles 150 are disposed substantially evenly spaced about an interior surface of the container sidewall 108. The top nozzles 150 are disposed to provide fluids to a top portion of the wafer and are positioned to provide sufficient space to allow vertical wafer movement between a processing position and a transfer position. The fluid delivery or spray pattern is controlled by the shape of the opening 151 in each of the top nozzles 150 and the fluid pressure. The shape of the opening 151 in each of the top nozzles 150 and the fluid pressure may, for example, limit fluid delivery to a selected area on the top surface 122t of the substrate 122. The openings 151 may conform to one of numerous shapes well known in the art, such as for example, circular, elliptical, etc.

Figure 4:
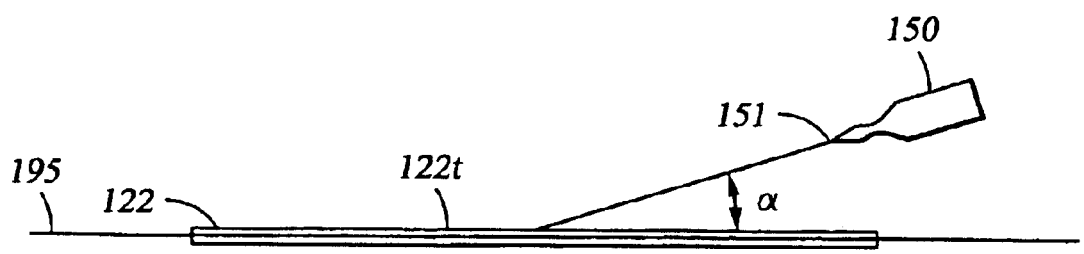
FIG. 4 depicts a schematic cross-sectional illustration of a side view of one embodiment of nozzle positions in an etch-back module that can be used for the practice of embodiments described herein.

Referring to FIGS. 2, 3 and 4, the top nozzles 150 are positioned so that the openings 151 in the nozzles are above a plane 195 defined by the substrate 122 to provide fluid at an angle of incidence, $\alpha$, to the top surface 122t of the substrate 122 that controls splashing of the etchant as the etchant comes into contact with the wafer. While FIGS. 2, 3, and 4 depict nozzle 150 positioned directly above substrate 122, one or more nozzles 150 may be positioned above plane 195, but not directly above substrate 122. Using the extendable dispense arm 152, the one or more top nozzles 150 can generally be positioned at any point above plane 195, as long as one or more nozzles 150 are capable of delivering fluid to the top surface of substrate 122.

FIG. 4 is a side view of a nozzle 150 disposed in relation to a substrate 122 being processed. Preferably, the angle of incidence, $\alpha$, of the etchant to the wafer is between about 0 degrees and about 45 degrees, more preferably between about 20 degrees and about 40 degrees.

Figure 5:
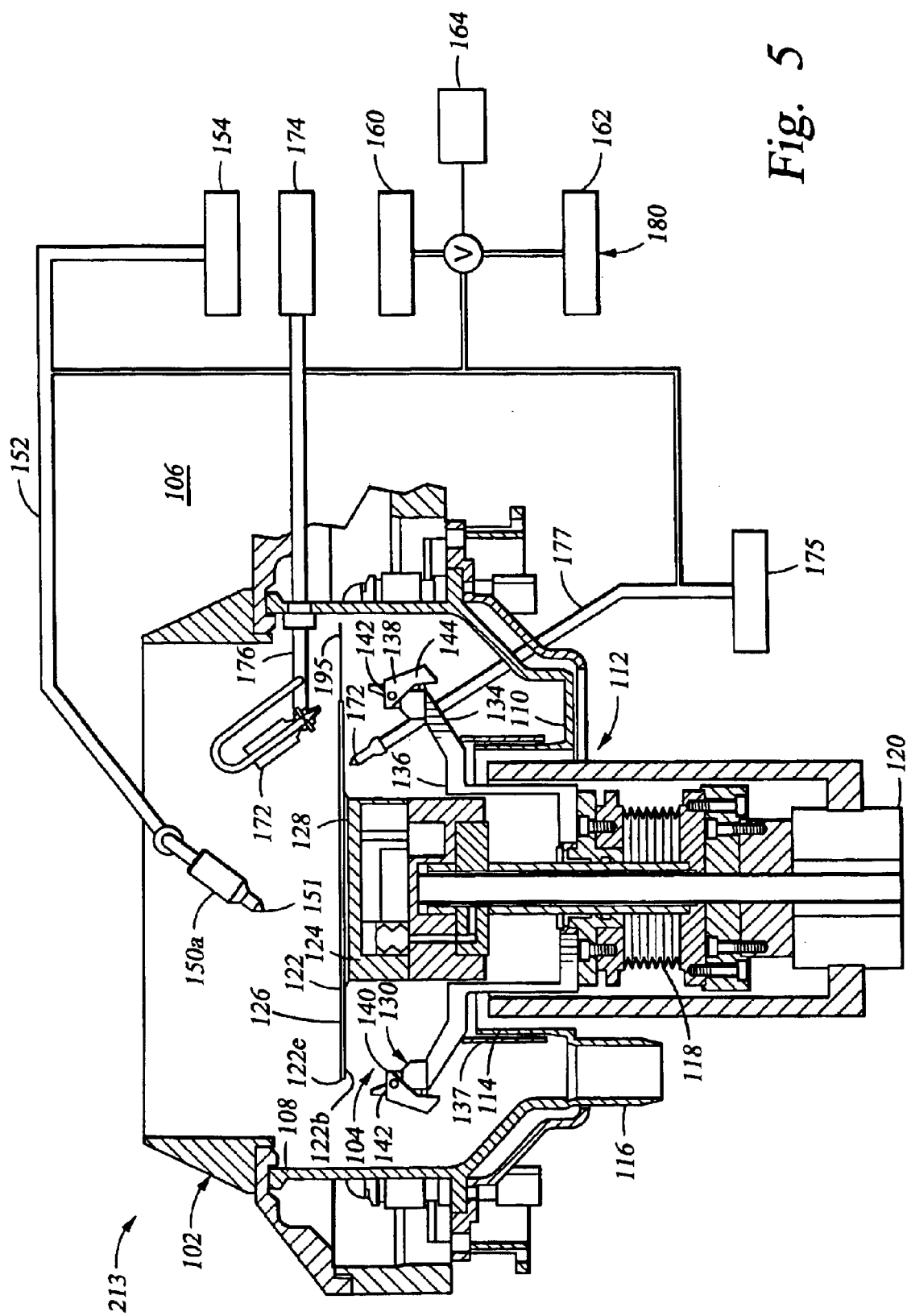
FIG. 5 depicts schematic cross-sectional illustration of a top view of a combination module that can be used for the practice of embodiments described herein.

FIG. 5 is a top cross sectional view of a combination module 213. The combination module comprises one or more first top nozzles 150a that are similar to top nozzles 150 described previously. Combination module 213 also comprises one or more additional nozzles 172 directed towards surfaces of the substrate other than top surface 122t.

This embodiment of the invention is useful for etching a metal conductive layer as well as removal of metal conductive material from other surfaces of the substrate 122, such as an edge 122e of the substrate 122 and a bottom surface 122b of the substrate 122. The components of the combination module 213 are similar to the components of the etch-back module 212 described above, and the same components are indicated by the same numbers. Additional nozzles 172 may be positioned above, below, or substantially coplanar to plane 195 defined by the substrate. The one or more additional nozzles 172 are designed to remove metal conductive material from the edge 122e or bottom surface 122b of the substrate 122.

The one or more additional nozzles 172 are selectively connected to one or more etchant sources 160 and one or more optional rinse fluid sources 162. The fluids delivered by the nozzles 172 are controlled by the controller 164. The one or more additional nozzles 172 are preferably disposed at positions that do not interfere with the movement of the wafer lift 130. The one or more additional nozzles 172 can also be attached to actuators 154, 174 through arms 176, 177 that retract and extend to position the nozzles 172 at desired locations. The additional nozzles 172 are positioned to provide the fluid at an angle of incidence to the surface of the wafer that controls splashing of the etchant as the etchant comes into contact with the wafer.

B. Dry Etch Apparatus

Figure 6:
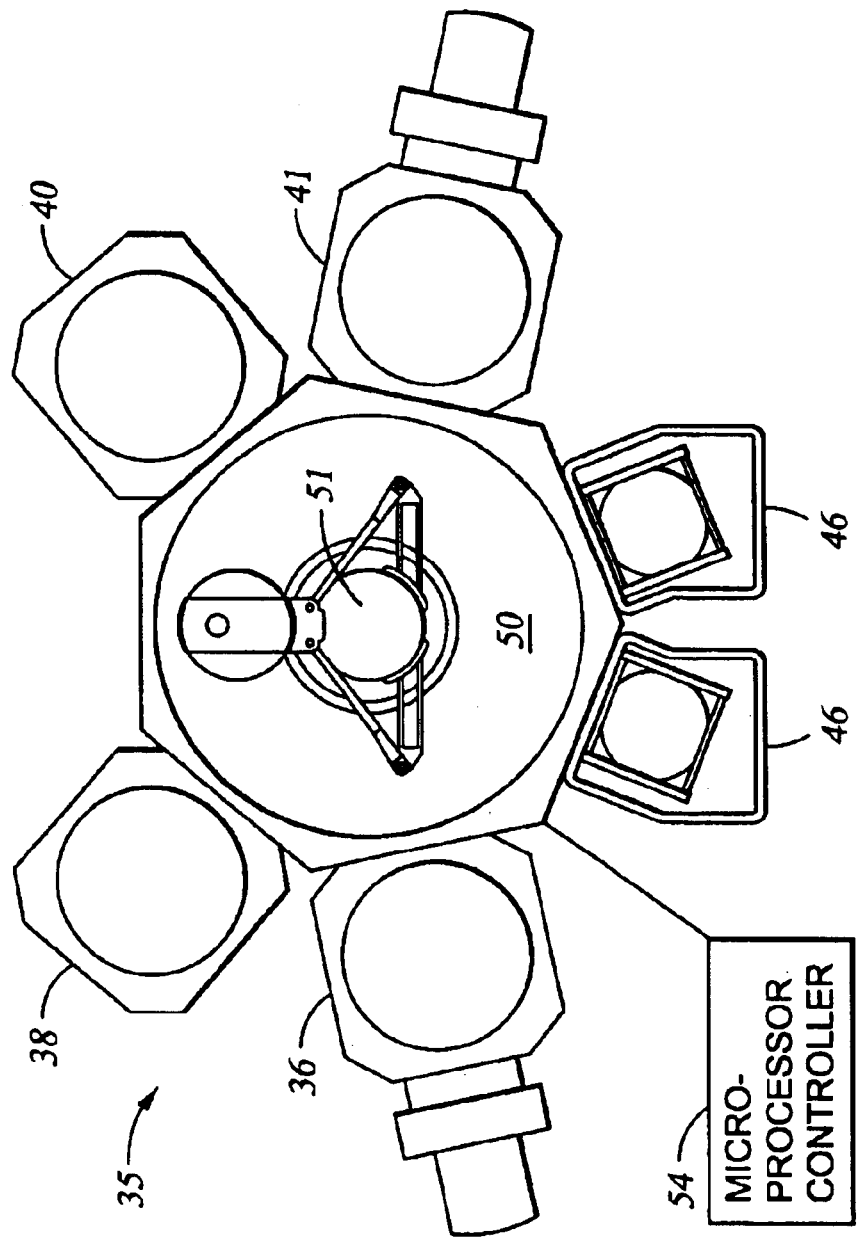
FIG. 6 depicts a schematic cross-sectional illustration of a deposition/etch platform.

FIG. 6 is a schematic representation of a wafer processing system 35 that can be used to perform integrated circuit fabrication in accordance with embodiments described herein. The wafer processing system 35 typically comprises process chambers 36, 38, 40, 41, a load-lock chamber 46, a transfer chamber 50, a microprocessor controller 54, along with other hardware components such as power supplies (not shown) and vacuum pumps (not shown). An example of such a wafer processing system 35 is an CENTURA® System, commercially available from Applied Materials, Inc., Santa Clara, Calif.

Details of the wafer processing system 35 are described in commonly assigned U.S. Pat. No. 5,186,718, entitled "Staged-Vacuum Substrate Processing System and Method", issued Feb. 16, 1993, which is hereby incorporated by reference. The salient features of the wafer processing system 35 are briefly described below.

A transfer chamber 50 contains a transfer robot 51. The transfer chamber 50 is coupled to load-lock chambers 46 as well as a cluster of process chambers 36, 38, 40, 41.

Substrates (not shown) are loaded into the wafer processing system 35 through load-lock chambers 46. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include plasma etch chambers, chemical vapor deposition (CVD) chambers, rapid thermal process (RTP) chambers, physical vapor deposition (PVD) chambers, ionized metal plasma physical vapor deposition (IMP PVD) chambers, and anti-reflective coating (ARC) chambers, among others.

Figure 7:
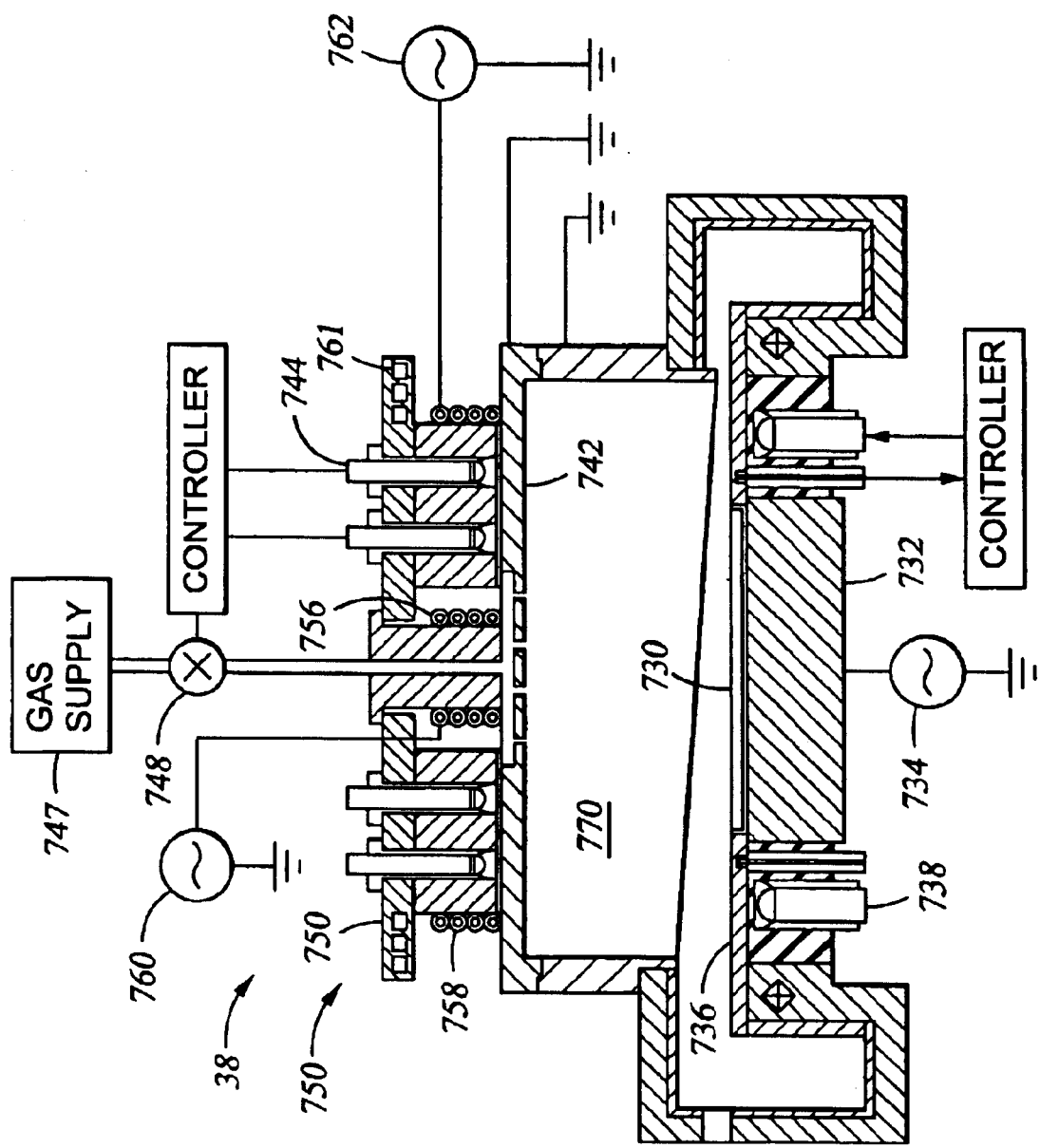
FIG. 7 depicts a schematic cross-sectional illustration of a plasma etch chamber that can be used for the practice of embodiments described herein.

FIG. 7 depicts a schematic cross-sectional view of a plasma etch process chamber 38 of wafer processing system 35. Plasma etch process chamber 38 may be used to etch metal conductive layers formed on a substrate, such as a semiconductor wafer. Examples of such plasma etch chambers 38 include MXP chambers and DPS chambers, commercially available from Applied Materials, Inc., Santa Clara, Calif.

Details of the plasma etch chamber 38 are described in commonly assigned U.S. Pat. No. 6,063,233, entitled, "Thermal Control Apparatus for Inductively Coupled RF Plasma Reactor having an Overhead Solenoid Antenna", issued May 16, 2000, which is hereby incorporated by reference. The salient features of the plasma etch process chamber 38 are briefly described below.

The plasma etch chamber 38 generally houses a cathode pedestal 732, which is used to support such as a substrate 730. A bias power supplied from a bias power source supply 734 to the cathode pedestal 732 capacitively couples the substrate 730 thereto. Application of the bias power to the cathode pedestal 732 also enhances the transport of plasma species (e.g. ions) created in the plasma etch process chamber 38 toward the surface of the substrate 730.

Depending on the specific process, the substrate 730 can be heated to some desired temperature prior to an etch process. For example the cathode pedestal 732 may be heated using a silicon ring 736. The silicon ring 736 surrounds the cathode pedestal 732 and is controllably heated by an array of heater lamps 738. The substrate 730 is, in turn, heated by the cathode pedestal 732.

A vacuum pump (not shown), is used to evacuate the plasma etch process chamber 38 and to maintain the proper gas flows and pressure inside the chamber 38. A showerhead 750, through which process gases are introduced into the plasma etch process chamber 38, is located above cathode pedestal 732. A showerhead 750 is coupled to a gas supply 747, which controls and supplies various gases used in different steps of an etch process sequence.

Proper control and regulation of the gas flows from the gas supply 747 is performed by mass flow controllers 748 and the microprocessor controller 54. The showerhead 750 allows process gases from the gas supply 747 to be uniformly introduced and distributed in the plasma etch process chamber 38.

A silicon roof 742 overlays a plasma processing region 770 of the plasma process chamber 38. Heating lamps 744 and water cooling channels 756 control the temperature of the silicon roof 742.

An inner inductive coil stack 756 and an outer inductive coil stack 758 are mounted above the silicon roof 742. The inner inductive coil stack 756 is coupled to RF power supply 760, and outer inductive coil stack 758 is coupled to RF power supply 762. The resistivity and thickness of the silicon roof 742 are chosen to permit axial RF magnetic fields produced by the inductive coil stacks 756, 758, to pass therethrough.

The inner inductive coil stack 756 and outer inductive coil stack 758 inductively couple RF energy through the silicon roof 742 into a plasma process region 770 of the plasma etch process chamber 38, generating a plasma of reactive species therein. Alternatively, a single RF power supply (not shown) with an adjustable splitter (not shown) may be coupled to both the inner inductive coil stack 756 and outer inductive coil stack 758.

The plasma etch process chamber 38 may also include an optical emission system (not shown). The optical emission system is used to provide optical spectra of any reactive species within the plasma etch chamber 38 during a plasma etch process.

Plasma etch chamber 38 as described above is controlled by a microprocessor controller 54. The microprocessor controller 54 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software or hardware.

While the plasma etch chamber 38 described above details a particular inductively coupled plasma system, it is within the scope of the invention to use other plasma generation methods. For example, chamber 38 may comprise a capacitively coupled plasma source. The plasma may be a high density plasma, generated by a technique such as high density reflected electron (Hre), arc plasma, electron cyclotron resonance (ecr), or other plasma generation techniques known to the art of thin film processing. In one embodiment, the plasma is generated in a remote plasma source coupled to etch chamber 38.

C. Wet Etch Process for Top Surface of Metal Conductive Layer

Figure 9A:
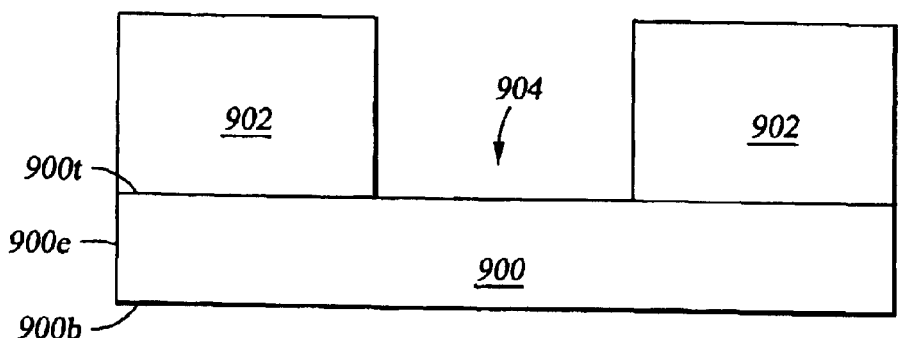
FIGS. 9a–9c depict schematic, cross-sectional illustrations of an interconnect structure during various stages of its construction, and the use of a wet etch process to reduce the thickness of a metal conductive layer thereon.
Figure 9B:
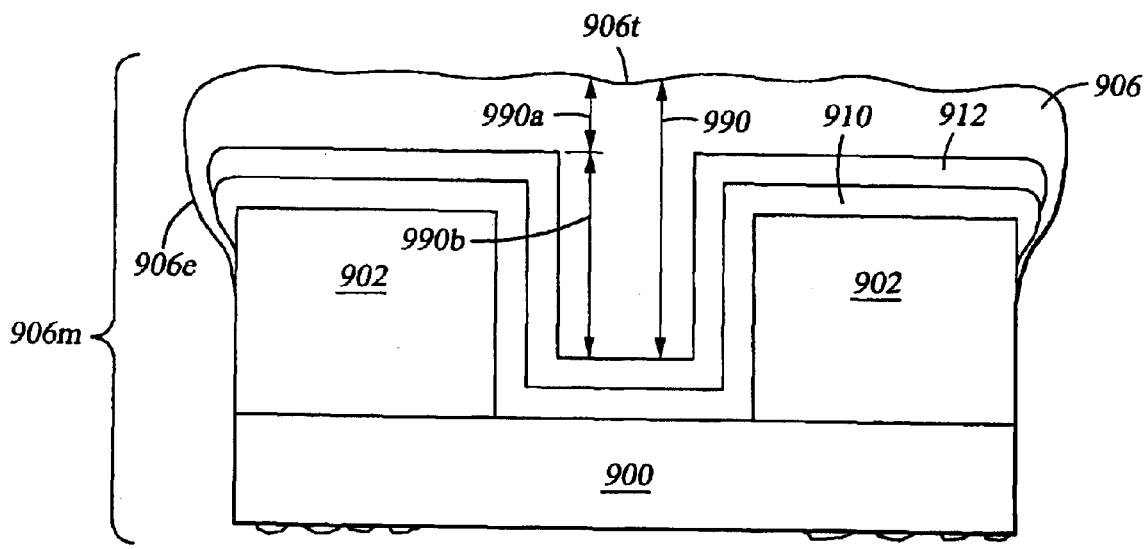
Figure 9C:
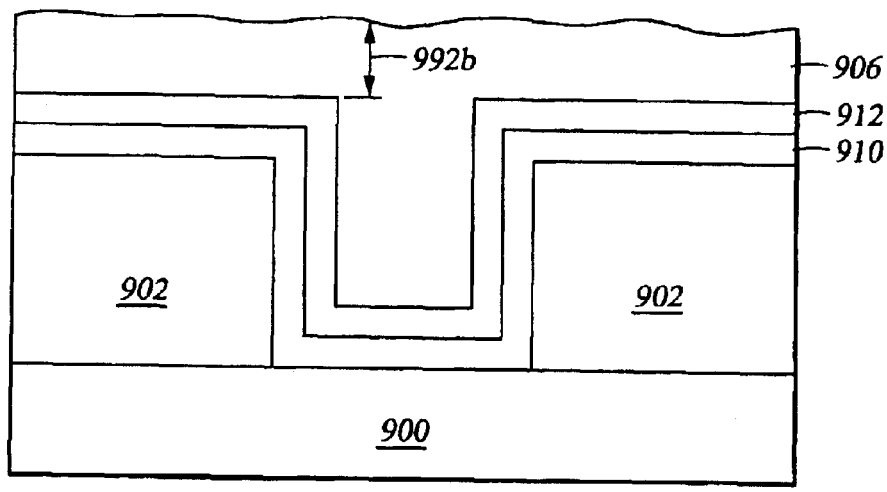

FIGS. 9a–9c illustrate schematic cross-sectional views of a substrate 900 at different stages of an integrated circuit fabrication sequence incorporating a metal conductive layer 906. In general, the substrate 900 refers to any workpiece on which layer processing is performed. Depending on the specific stage of processing, the substrate 900 may correspond to a silicon or semiconductor substrate, or other material layers, which have been formed on the substrate. Substrate 900 has a top surface 900t, an edge 900e, and a bottom surface 900b. FIG. 9a, for example, illustrates a cross-sectional view of a substrate structure in which the substrate 900 is a silicon wafer having a material layer 902 disposed atop at least a portion of top surface 900t of substrate 900.

The material layer 902 may be, for example, a dielectric layer, such as, for example, silicon oxide or other insulating material. In one embodiment, material layer 902 has at least one opening 904 formed therein. While FIG. 9a depicts a rectangular opening 904, the via may have any other cross-sectional shape. The aspect ratio of the opening 904, defined as the height of the opening divided by its width, is typically about 4 or greater.

In one embodiment, a barrier layer 910 is conformally coated over material layer 902 and inside opening 904 as shown in FIG. 9b. The barrier layer may comprise, for example, one or more layers of tantalum-containing material. Barrier layer 910 reduces the likelihood of the diffusion of metal-species (e.g. copper), or non-metal species (e.g. fluorine) between various material layers, and thereby improves the electrical integrity of the interconnect structure. Furthermore, a seed layer 912 may be conformally coated atop the barrier layer 910. The seed layer typically comprises a metal, such as, for example, copper. The seed layer may be formed by a process, such as, for example, electroless deposition.

As shown in FIG. 9b, a metal conductive layer 906 is deposited atop seed layer 910. Metal conductive layer 906 may comprise, for example, aluminum, tungsten, copper, or combinations thereof. In a preferred embodiment, metal conductive layer 906 comprises copper. The metal conductive layer may be formed by one or more methods known to the art of semiconductor processing, such as, for example, electrochemical plating. Electrochemical plating typically comprises depositing a metal conductive layer using an applied electrochemical potential to transport conductive species through an electrolyte medium onto a substrate. Metal conductive layer may be deposited by electrochemical plating using an electroplating system platform, such as, for example, electroplating system platform 200, illustrated in FIG. 1. Alternatively metal conductive layer 906 may be formed using other methods known to the art of semiconductor processing such as, for example, physical vapor deposition or chemical vapor deposition.

Metal conductive layer 906 has a top surface 906t characterized by substantial surface roughness. In one embodiment, the surface roughness of top surface 906t may be greater than about 70 Angstroms. Stray metal conductive material 906m may be deposited inadvertently on an edge 900e of the substrate to form stray edge metal 906e. Stray metal conductive material 906m may also be deposited on portions of the bottom surface 900b of the substrate 900 to form stray bottom metal 906b. The stray metal conductive material 906m that forms stray edge metal 904e and stray bottom metal 906b may have inadvertently resulted from deposition of metal conductive layer 906 or other processes.

Referring again to FIG. 9b, metal conductive layer 906 completely fills opening 904. The metal conductive layer 906 typically has a pre-etch thickness 990 that is approximately equal to the sum of a feature thickness 990b and a pre-etch field thickness 990a. The pre-etch field thickness 990a is defined as the thickness of the portion of metal conductive layer 906 that resides above material layer 902, barrier layer 910, and seed layer 912 as shown in FIG. 9b, before the wet etch process begins. The pre-etch field thickness 990a is preferably greater than about 0.2 microns. In an alternate embodiment, metal conductive layer 906 is formed on either a material layer or substrate that does not have an opening therethrough.

Figure 8:
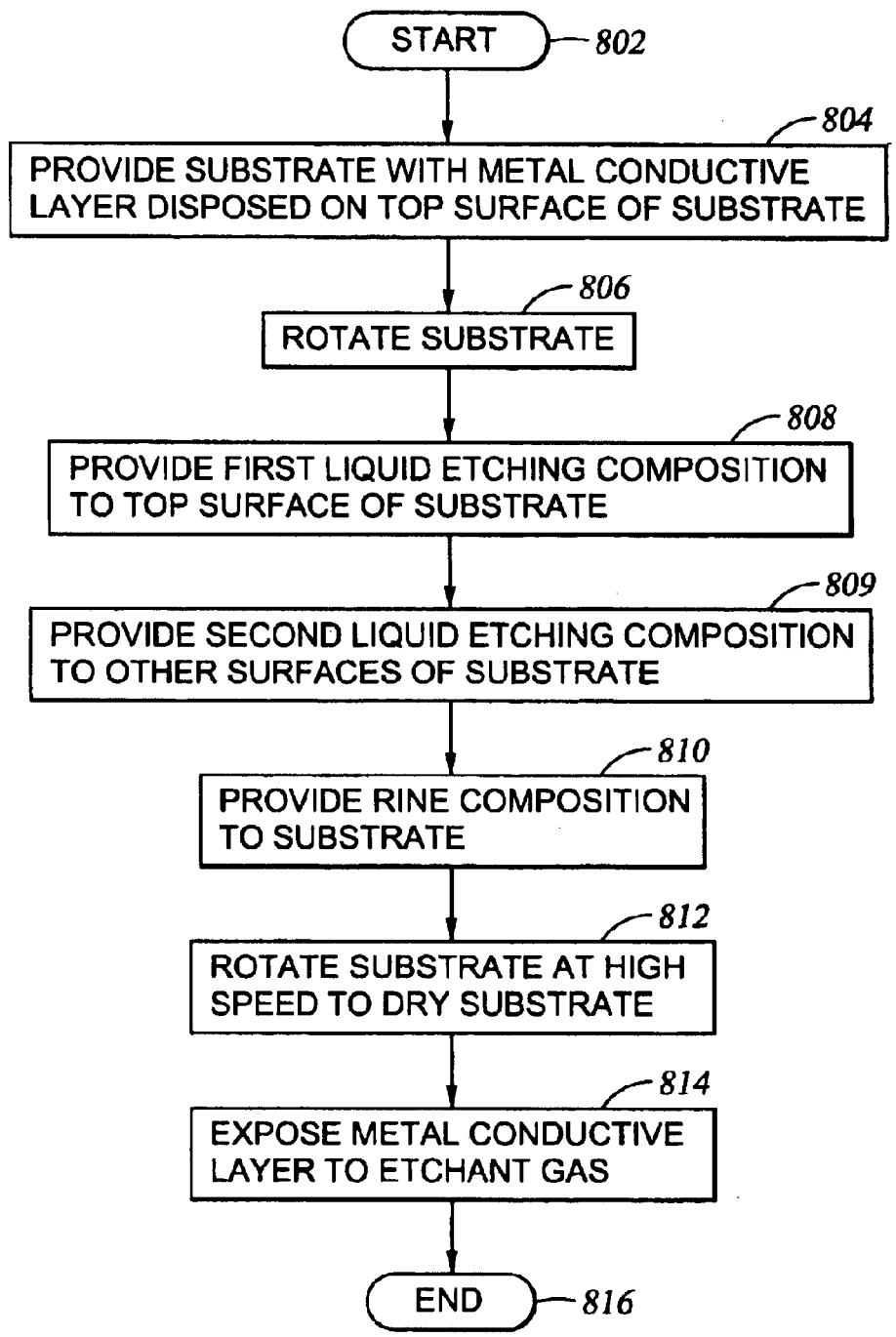
FIG. 8 depicts a series of method steps for planarizing a conductive layer.

FIG. 8 illustrates a series of method steps for planarizing metal conductive layer 906 on substrate 900. Optional process steps are indicated with dashed lines. A series of method steps 800 begins at step 802 and proceeds to step 804 in which substrate 122 having a metal conductive layer 906 formed thereon is inserted into a chamber, such as an etch back chamber 212 or combination chamber 213, using the mainframe transfer robot 242. The substrate 122 is positioned above the wafer holder assembly 104 of the etch-back module 100, and the wafer lift 130 lifts the wafer off of the transfer robot blade. The robot blade retracts and the wafer lift 130 lowers the wafer onto the vacuum chuck 124. The vacuum system is activated to secure the substrate 900 thereon.

As shown in FIG. 8, step 806, during the liquid etching process, the substrate 900 may be rotated using a means for rotating the substrate 900 such as, for example, rotation assembly 120 of etch back module 212. The substrate is rotated at a rotation speed of at least about 150 rpm, preferably in the range of about 500 to about 3500 rpm.

As indicated in FIG. 8, the process proceeds to step 808, in which a liquid etching composition is provided to metal conductive layer 906 residing atop the top surface 900t of substrate 900. The liquid etching composition selected should be one that will dissolve or react with the metal to be removed. Materials which may be used, depending on the metal to be removed, include nitric acid, hydrochloric acid, persulfates and peroxygen compounds, as well as other commercially available etchants and oxidizers and combinations thereof. The liquid etching composition may further comprise a diluent, such as, for example, deionized water. The liquid etching composition may be stored in a storage vessel and provided directly to the metal conductive layer 906 via one or more top nozzles 150. Alternatively, the liquid etching composition may be formed in-situ by combining etchants from one or more etchant sources, such as etchant sources 160, illustrated in FIG. 2. The optional diluent may be provided from a separate storage vessel, such as rinse source 162 and mixed in situ with the one or more etchants from one or more etchant sources 160 to form liquid etching composition. In one embodiment, the liquid etching composition has a concentration of sulfuric acid (H2SO4) of about 2% by weight and a concentration of hydrogen peroxide (H2O2) of about 6% by weight.

The liquid etching composition is applied at a pressure selected for efficient removal of the conductive material. Usually, a pressure in the range of about 10 psi to about 40 psi is adequate. The composition is applied to metal conductive layer 906 through one or more top nozzles 150 while the substrate 900 rotates. The rotation of substrate 900 provides substantially uniform exposure of the top surface of the metal conductive layer 906 to the liquid etching composition. The liquid etching composition may be provided in a continuous stream of liquid or in discrete pulses. It is preferred that the substrate 900 continue rotating throughout the entire duration of time that the liquid etching composition is provided to metal conductive layer 906.

Preferably, the substrate 900 is rotated in the same direction as the direction of the liquid etching composition spray to facilitate controlled removal of portions of the metal conductive layer 906. For example, as shown in FIG. 3, the substrate 900 is rotated in a counter-clockwise direction (arrow A) and liquid etching composition is delivered from top nozzles 150 in a counter-clockwise spray pattern. The substrate 900 is preferably rotated at least about 150 rpm, more preferably between about 500 rpm and about 3500 rpm.

The effective etch rate (i.e., the amount of metal conductive layer 906 removed divided by the time required for removal) is a function of the composition of the liquid etching composition, the composition of the metal conductive layer 906, the duration of contact the velocity of the liquid etching composition contacting the substrate 900, the temperature of the liquid etching composition, and the velocity of the rotation. These parameters can be varied to achieve particular desired results. In one embodiment, sufficient material is removed from metal conductive layer 906 such that metal conductive layer 906 has a post wet etch field thickness 992b, as shown in FIG. 9c less than about 500 Angstroms. The post wet etch field thickness is defined as the thickness of the portion of metal conductive layer 906 that resides above material layer 902, barrier layer 910 and seed layer 912, after the wet etch process is completed, as shown in FIG. 9b. Typically, the effective etch rate of metal conductive layer 906 is in the range of about 5000 to about 100,000 Angstroms/minute.

Optionally a rinse composition may be provided to the metal conductive layer 906, as indicated in step 810 of FIG. 8. The rinse composition is preferably provided by one or more nozzles, such as the one or more top nozzles 150. The delivery of rinse composition may be simultaneous to the delivery of the liquid etching composition. Alternatively, delivery of liquid rinse composition may occur at a completely separate period of time than the delivery of liquid etching composition. The delivery of liquid rinse composition may be pulsed or continuous. Multiple cycles of etching and rinsing are also contemplated.

After a period of time that may be preselected, the delivery of liquid etching composition and liquid rinse composition are halted and rotation of the substrate 900 is stopped. Substrate 900 may, for example, be transferred to another processing station on the same platform to undergo additional processing. Substrate 900 may be dried, as shown in step 812, by rotating substrate 900 at high speed in order to remove liquid etching composition and/or liquid rinse composition from substrate 900 and material layers thereon. (Stray edge metal 904e and stray bottom metal 906b that are still present after step 810 may be removed in subsequent processing operations.)

D. Wet Etch Combination Process

Figure 10A:
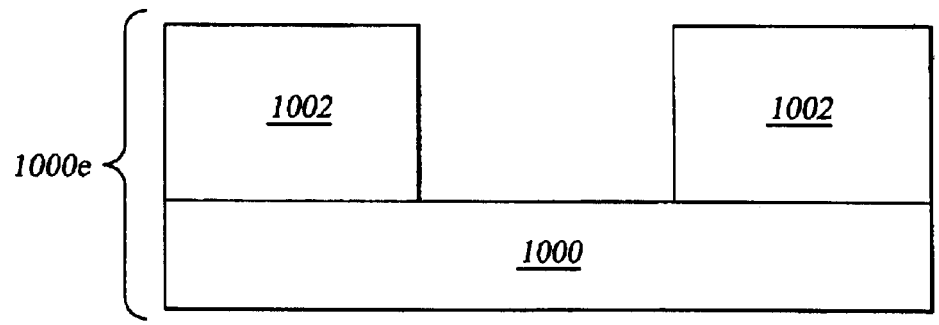
FIGS. 10a–10c depict schematic, cross-sectional illustrations of a second interconnect structure during various stages of its construction, and the use of a wet etch process to remove metal conductive material from various surfaces thereon.
Figure 10B:
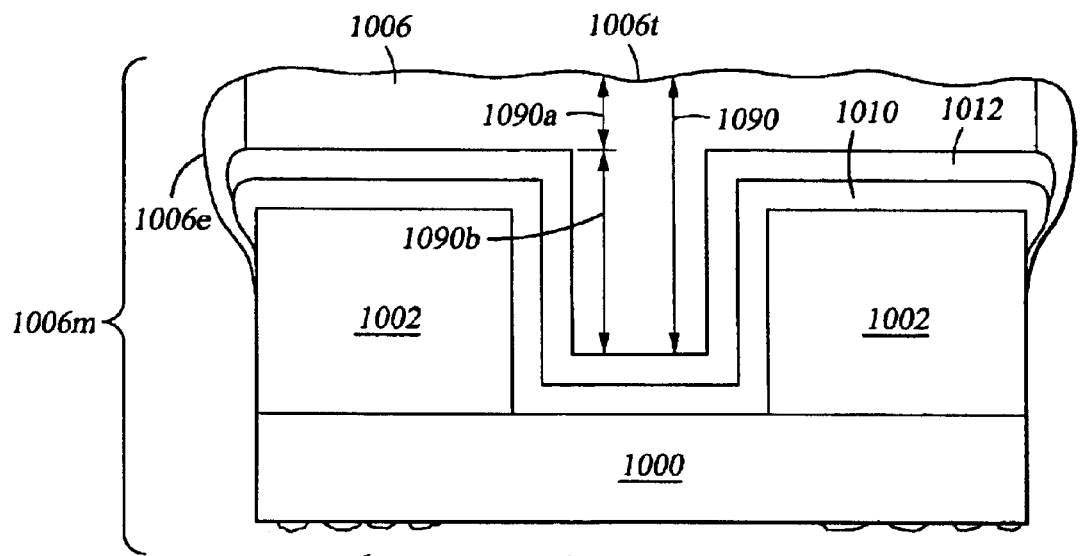
Figure 10C:
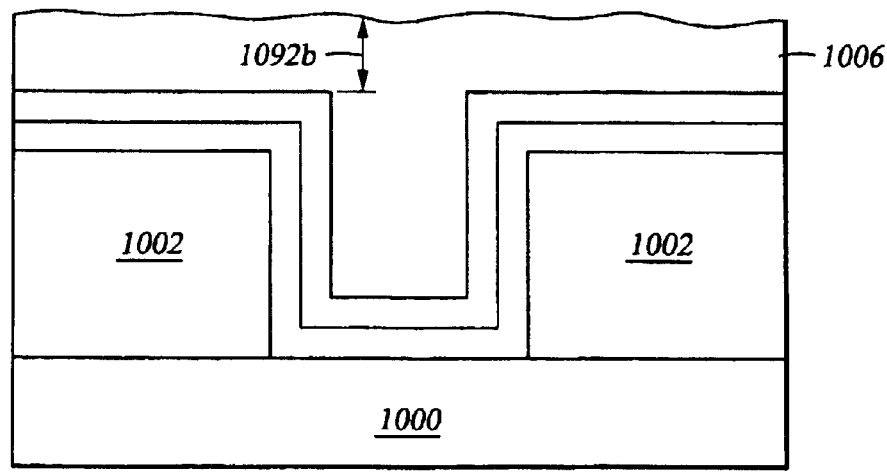

FIGS. 10a, 10b, and 10c depict schematic, cross-sectional illustrations of a second interconnect structure during various stages of its construction, and the use of a wet etch process to remove metal conductive material from various surfaces thereon. As shown in FIG. 10a, in another embodiment of the invention, a metal conductive layer 1006 is provided atop material layer 1002. Referring to FIG. 10b, in one embodiment, a barrier layer 1010 and a seed layer 1012 are conformally coated atop material layer 1002. The barrier layer 1010 and seed layer 1012 have a composition similar to the barrier layer 910 and the seed layer 912 in FIG. 9. Stray metal conductive material 1006m may be provided on an edge 1000e of the substrate to form stray edge metal 1006e. Furthermore, stray metal conductive material may be deposited on the bottom surface 1000b of the substrate 1000 to form stray bottom metal 1006b. The stray metal conductive material forming stray edge metal 1006e and stray bottom metal 1006b may result from the metal deposition process. Metal conductive layer 1006 has a composition and surface roughness as described above for metal conductive layer 906. Metal conductive layer 1006 has a top surface 1006t.

As described previously in process steps 804 and 806, substrate 1000 with material layer 1002 and metal conductive layer 1006 thereon is placed in a module, such as, for example, combination module 213, and substrate 1000 is rotated. Referring to FIG. 2 and FIG. 5, one or more top nozzles 150 are positioned above a plane 195 defined by the substrate 1000, and nozzles 172 are positioned above, below, or substantially coplanar to plane 195. The process then proceeds to step 808. Liquid etching composition is provided to the top surface 1006t of metal conductive layer 906 from top nozzles 150. The process then proceeds to optional step 809, in which a second liquid etching composition is provided to other surfaces of the substrate 1000 through additional nozzles 172. The other surfaces may include edge 1000e and bottom surface 1000b. Stray edge metal 904e and stray bottom metal 904b as well as portions of metal conductive layer 1006 on the top surface of substrate 1000 are thereby removed.

The composition of liquid etch composition, the composition of the liquid rinse composition, the rotation speed, direction of rotation, as well as other process parameters are as described in the above for the wet etch process for the top surface of metal conductive layer. The liquid etching composition is provided through one or more top nozzles 150. A second liquid etching composition is provided through one or more additional nozzles 172. The second liquid etching composition generally comprises one or more etchants, such as those etchants described previously.

While the preceding discussion teaches the use of two liquid etching compositions, more than two liquid etching compositions are also contemplated in order to provide different etching compositions to various surfaces of substrate 1000. For example, second liquid etching composition may be provided to edge 1000e, and a third etching composition may be provided to bottom surface 1000b.

Delivery of liquid etch compositions through top nozzles 150 and nozzles 172 may take place simultaneously or at different points in time. Preferably, liquid etch composition is delivered through nozzles 172 for a sufficient period of time to substantially remove stray bottom metal 1006b and stray edge metal 1006e. In one embodiment, liquid etch composition is delivered through top nozzles 150 to metal conductive layer 1006 for a duration of time in order to etch metal conductive layer 1006 to a post wet etch field thickness field thickness 1092b, as shown in FIG. 10c less than about 500 Angstroms.

Optionally, a rinse composition is provided to the top surface 1006t of metal conductive layer 1006 and to edge 1006e and bottom surface 1006b, as indicated in step 810. Substrate 1000 is optionally rotated at high speed in order to dry substrate 1000, as indicated in step 812.

E. Dry Etch Process

Referring to FIG. 11 and again to FIG. 8, the wet etch procedure described above may be used to remove most, but not all of a metal conductive layer on a substrate. The wet etch process proceeds fairly rapidly, but is generally not accurate enough to remove all of the conductive material without the possibility of damaging the barrier layer. Thus, the wet etch alone might, in some applications, leave some of the conductive metal in the field and/or penetrate the barrier layer. In such applications, according to this invention the wet etch is followed by a dry etch, as hereinafter described. The dry etch proceeds move slowly then the wet etch and is more easily controlled to remove all, or substantially all of the conductive layer from the field without damaging the barrier layer.

Figure 11A:
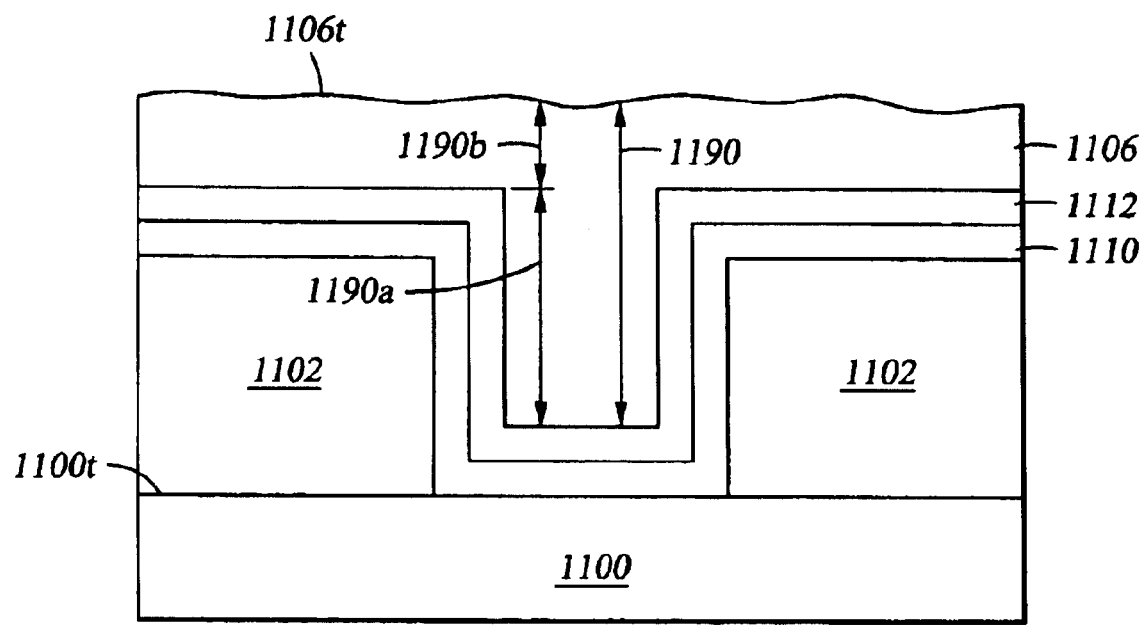
FIGS. 11a–11b depict schematic, cross-sectional illustrations of an interconnect structure during the various stages of its construction, and the use of a dry etch process to form a conductive feature thereon.
Figure 11B:
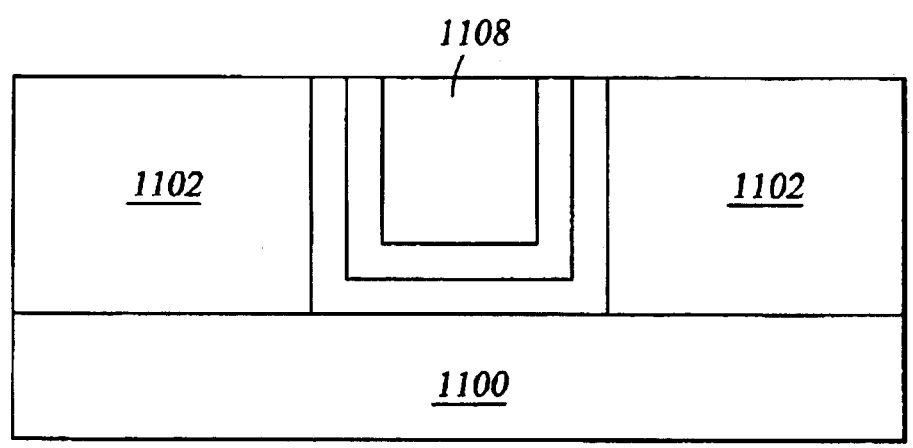

FIGS. 11a–11b illustrate schematic cross-sectional views of a substrate 1100 at different stages of an integrated circuit fabrication sequence incorporating a metal conductive layer 1106. In general, the substrate 1100 refers to any workpiece on which layer processing is performed. Depending on the specific stage of processing, the substrate 1100 may correspond to a silicon or semiconductor wafer, or other material layers, which have been formed on the substrate. Substrate 1100 has a top surface 1100t. FIG. 11a, for example, illustrates a cross-sectional view of a substrate structure in which the substrate 1100 is a silicon wafer having a material layer 1102 disposed atop at least a portion of top surface 1100t of substrate 1100. The material layer 1102 may be, for example, a dielectric layer, such as, for example, silicon oxide or other insulating material.

In one embodiment, a barrier layer 1110 and a seed layer 1112 are conformally coated atop material layer 1102. The barrier layer 1110 and seed layer 1112 have a composition similar to the barrier layer 910 and the seed layer 912 in FIG. 9.

Metal conductive layer 1106 may comprise, for example, aluminum, tungsten, copper, or combinations thereof. In a preferred embodiment, metal conductive layer 1106 comprises copper. Referring again to FIG. 11a, metal conductive layer 1106 completely fills opening 1104. The metal conductive layer 1106 typically has a thickness 1190 that is approximately equal to the sum of feature thickness 1190a and post wet-etch field thickness 1190b.

Substrate 1100 with metal conductive layer 1106 formed thereon is introduced into a chamber, such as, for example, plasma etch process chamber 38. Metal conductive layer 1106 is etched by introducing an etchant gas into chamber 38 and allowing the etchant gas to contact the metal conductive layer 1106, as shown in step 814. In a preferred embodiment, the etchant gas is ignited into a plasma, and energized species within the plasma are allowed to contact metal conductive layer 1106. The etchant gas generally comprises a material selected from the group consisting of chlorine-containing materials bromine-containing materials, fluorine-containing materials, and combinations thereof. The chlorine-based material may, for example, be selected from the group consisting of chlorine ($Cl_2$), Boron trichloride ($BCl_3$), and trichloromethane ($CHCl_3$). The bromine-based material may be, for example, hydrogen bromide (HBr). The fluorine-based material may, for example, be selected from the group consisting of sulfur hexafluoride ($SF_6$), nitrogen trifluoride ($NF_3$), hexafluoroethane ($C_2F_6$). The gas mixture may optionally include inert gases such as nitrogen, helium, argon, and combinations thereof, among others.

In general, the following process parameters can be used to generate a plasma in a process chamber similar to that shown in FIG. 7. The process parameters range from a chamber temperature of about 20 degrees Celsius to about 100 degrees Celsius, a chamber pressure of about 0.1 torr to about 1 torr, a flow rate of etchant gas of about 10 sccm to about 200 sccm, an inert gas flow rate of about 100 sccm to about 500 sccm, a radio frequency power of about 100 watts/cm2 to about 5000/cm2, and a bias power from about 100 watts to about 1000 watts. The above process parameters provide an etch rate for the metal conductive layer 1106 in a range of about 500 Angstroms/minute to about 5000 Angstroms/minute when implemented on a process chamber available from Applied Materials, Inc. of Santa Clara, Calif. and configured to accommodate 200 mm substrates.

Energized species, such as, for example, ions and neutral particles within the plasma contact the top surface of the metal conductive layer 1106 and remove portions thereof. The method ends at step 816. The plasma etch process described is generally more easily controlled than the wet-etch process described previously. The top surface 1106t of metal conductive layer 1106 is planarized by the plasma etch process. The planarization of top surface 1106t of metal conductive layer 1106 forms a conductive feature 1108, as indicated in FIG. 11b.

The method and apparatus of the present invention allows for the planarization of metal layers without the use of aggressive chemical mechanical polishing slurries. The method is also advantageous in that one may reduce the thickness of a metal conductive layer using a fast wet etch process and then perform a controlled dry etch process to planarize the layer.

The method and apparatus of the present invention is compatible with integrated circuit formation. Conductive features are readily formed and planarized. Furthermore, it is possible to improve the throughput of integrated circuit processing operations by eliminating the entire CMP processing platform, and conducting an etching and polishing process within in a deposition platform.

Although several preferred embodiments which incorporate the teachings of the present invention have been shown and described in detail, those skilled in the art can readily devise many other varied embodiments that still incorporate these teachings.

What is claimed is:

1. A method of processing a metal conductive layer on a substrate, comprising:

(a) placing a substrate on a substrate support wherein the substrate has a metal conductive layer disposed on a top surface of the substrate, and wherein the substrate has stray metal conductive material on one or more other surfaces of the substrate;

(b) rotating the substrate support;

(c) while the substrate support is rotating, contacting the top surface of the substrate with a first liquid etching composition in order to remove portions of the top surface of the metal conductive layer;

(d) contacting the one or more other surfaces of the substrate with a second liquid etching composition in order to remove stray metal conductive material thereon; and (e) exposing the metal conductive layer to an etchant gas after (c) in order to planarize the top surface of the metal conductive layer.

2. The method of claim 1 wherein (e) is performed after (d).

3. The method of claim 2 wherein the etchant gas comprises a chlorine-containing material.

4. The method of claim 1 wherein the metal conductive layer comprises copper.

5. The method of claim 1 wherein the substrate is rotated in a direction of rotation and the liquid etching composition is delivered in a direction of delivery, and wherein the direction of rotation and the direction of delivery are the same.

6. The method of claim 1 wherein the first liquid etching composition and the second liquid etching composition comprise one or more of the same or different etchants, selected from the group consisting of nitric acid, hydrochloric acid, peroxygen compounds, and combinations thereof.

7. The method of claim 1 wherein the liquid etching composition is delivered to the top surface of the substrate by one or more top nozzles and the same or a different liquid etching composition is delivered to the one or more other surfaces of the substrate by one or more additional nozzles.

8. The method of claim 1 further comprising contacting the metal conductive layer with a rinse composition.

9. The method of claim 1 further comprising igniting the etchant gas into a plasma.

10. A method of processing a metal conductive layer on a substrate, comprising:

(a) placing a substrate on a substrate support in an electroplating cell on an electroplating platform;

(b) depositing a copper layer on a top surface of the substrate, wherein the substrate has stray copper on one or more other surfaces of the substrate;

(c) moving the substrate to an etch-back module on the electroplating platform;

(d) rotating the substrate support;

(e) while the substrate support is rotating, spraying the top surface of the substrate with a first liquid etching composition in order to remove portions of the top surface of the copper layer, the spray being directed in the direction of rotation;

(f) contacting the one or more other surfaces of the substrate with a liquid etching composition in order to remove stray copper thereon; and (g) exposing the metal conductive layer to an etchant gas after (e) in order to planarize the top surface of the copper layer.

* * * * *

UNITED STATES PATENT AND TRADEMARK OFFICE
CERTIFICATE OF CORRECTION

PATENT NO. : 6,770,565 B2
DATED : August 3, 2004
INVENTOR(S) : Olgado et al.

It is certified that error appears in the above-identified patent and that said Letters Patent is hereby corrected as shown below:

Column 5,
Line 58, change "wafers" to -- wafer, --

Column 13,
Line 15, delete "field thickness".
Line 33, change "move slowly then" to -- more slowly than --.

Column 14,
Line 8, insert a comma after the first occurrence of "containing materials".

Signed and Sealed this

Twenty-first Day of December, 2004

JON W. DUDAS
*Director of the United States Patent and Trademark Office*